United States Patent
Morales et al.

(10) Patent No.: US 6,177,345 B1
(45) Date of Patent: Jan. 23, 2001

(54) METHOD OF SILICIDE FILM FORMATION ONTO A SEMICONDUCTOR SUBSTRATE

(75) Inventors: Guarionex Morales, Santa Clara; Jianshi Wang, San Jose; Judith Q. Rizzuto, Los Gatos; Hao Fang, Cupertino, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/080,405

(22) Filed: May 18, 1998

(51) Int. Cl.[7] .................................................. H01L 21/44
(52) U.S. Cl. ..................... 438/655; 438/664; 438/682; 438/630; 438/649; 438/651; 438/592
(58) Field of Search .................................. 438/655, 630, 438/682, 683, 664, 660, 663, 651, 648–649, 592, 583, 581

(56) References Cited

U.S. PATENT DOCUMENTS

| | | | | |
|---|---|---|---|---|
| 5,041,394 | * | 8/1991 | Spratt et al. ........................ | 438/533 |
| 5,203,956 | * | 4/1993 | Hansen ................................ | 156/643 |
| 5,280,190 | * | 1/1994 | Lu ....................................... | 257/587 |
| 5,482,749 | * | 1/1996 | Telford et al. ...................... | 427/578 |
| 5,543,635 | * | 8/1996 | Nguyen et al. ..................... | 257/66 |
| 5,856,237 | * | 1/1999 | Ku ....................................... | 438/683 |
| 5,972,785 | * | 10/1999 | Shishiguchi et al. .............. | 438/592 |

OTHER PUBLICATIONS

Wolf "Silicon Processing for the VLSI Era" vol. 1, pp. 392–393, 1986.*
Wolf "silicon processing for the VLSI ERA" vol. 1, pp. 516–518, 1986.*
S. Wolf et al., Silicon Processing for the VLSI Era, vol. 1, pp. 140–141, 388–393, 398–401.

* cited by examiner

Primary Examiner—Charles Bowers
Assistant Examiner—Thanh Nguyen
(74) Attorney, Agent, or Firm—Foley & Lardner

(57) ABSTRACT

A method of depositing metal silicide onto a semiconductor substrate includes a step of depositing, by a CVD process, a first metal silicide layer with silane gas onto the semiconductor substrate. The method also includes a step of thermally treating and chemically cleaning the semiconductor substrate. The method further includes a step of depositing, by the CVD process, a second metal silicide layer with silane gas onto the semiconductor substrate. By this method, cracks in the metal silicide formed on the semiconductor substrate are minimized.

19 Claims, 4 Drawing Sheets

METHOD OF SILICIDE FILM FORMATION ONTO A SEMICONDUCTOR SUBSTRATE

BACKGROUND OF THE INVENTION

1. Field of the Invention

The present invention relates to the deposition of $WSi_x$ with a silane gas onto a semiconductor substrate. In particular, the present invention relates to the deposition of $WSi_x$ in order to lessen problems associated with peeling and cracking that may occur on the WSix layer after thermal processing of the semiconductor substrate.

2. Description of the Related Art

An epitaxial growth process is used in semiconductor wafer fabrication in order to deposit a thin layer (e.g., 0.5 to 20 μm) of a single crystal material upon a surface of a single crystal substrate, such as silicon.

Epitaxial growth can be accomplished from a vapor phase (VPE), a liquid phase (LPE), or from a solid phase (SPE). For silicon substrates, VPE is the most widely accepted method for achieving epitaxial growth.

One important motivation for developing epitaxial growth processes is to improve the performance of bipolar and field effect transistors, as well as other types of integrated circuits. By growing a lightly doped epitaxial layer over a heavily doped silicon substrate, the bipolar device can be optimized for high breakdown voltage of the collector-substrate junction, while still maintaining low collector currents.

One type of epitaxial deposition process is known as chemical vapor deposition (CVD). As described in "Silicon Processing for the VLSI Era", Volumes I–III, by Stanley Wolf (1986 edition), the following five steps are fundamental to all CVD processes: 1) the reactants are transported to the substrate surface, 2) the reactants are adsorbed on the substrate surface, 3) a chemical reaction takes place on the surface leading to the formation of the film (the "product") and reaction by-products, 4) the reaction by-products are desorbed from the surface, and 5) the by-products are transported away from the surface.

S. Wolf's book also states that there are four major chemical sources of silicon used commercially for epitaxial deposition: 1) silicon tetracholoride ($SiCl_4$), 2) trichlorosilane ($SiHCl_3$), 3) dicholorosilane ($SiH_2Cl_2$), and 4) silane ($SiH_4$). Of these chemical sources, silane has been the most widely used.

Defects may occur due to the epitaxial deposition, such as dislocations and stacking faults. Dislocations are generated in epitaxial films by several mechanisms, including: a) the propagation into the growing film of a dislocation line in the substrate that reaches the substrate surface, b) the existence of a large difference in lattice parameter between the film and the substrate, and c) by thermally generated stresses that exceed the yield strength of the silicon, resulting in a slip. Stacking faults result from two distinct causes: a) microscopic surface steps on the surface, and b) impurities either on the surface or within the reactor itself. See S. Wolf, Volume I, pages 140–141.

Defects can be reduced by using radiant heaters or by using low lamp power, which, eliminate the electrostatic migration of particles. Also, defects in the epitaxial layers can be reduced by the use of denuded zones and oxygen intrinsic gettering of the substrates prior to deposition. Still another way of reducing defects is to use strain layers. Each of these techniques is discussed in detail in the S. Wolf reference listed above.

The use of $SiCl_4$ requires high deposition temperatures (currently in a range of from 1000–1200 °C.), which results in significant autodoping and outdiffusion. An advantage of using $SiCl_4$ is that very little deposition occurs on the reactor walls, thereby reducing the frequency of cleaning. Thus, SiCl4 is useful for thick deposits (>3 μm) on devices that can tolerate the elevated temperature.

$SiHCl_3$ has similar properties to $SiCl_4$, and it is also deposited at high deposition temperatures. $SiHCl_3$ is used primarily for depositing thicker epitaxial layers.

$SiH_2Cl_2$ is used to deposit thinner layers at lower temperatures (currently in a range of from 500–600° C.). The lower temperature reduces outdiffusion and autodoping. Typical, films prepared from $SiH_2Cl_2$ have lower defect densities than those prepared either from $SiH_4$ or $SiCl_4$.

$SiH_4$ is used to deposit very thin epitaxial layers at lower temperatures (currently in a range of from 350–475° C.). This results in substantially less autodoping and outdiffusion when compared to films deposited at higher temperatures using other chemical sources. A disadvantage of $SiH_4$ is that frequent cleanings of reactor walls are typically required, since it can pyrolize (decompose) at low temperatures, causing heavy deposits on reactor walls.

In order to effectively utilize refractory metal silicides in VLSI fabrication, stringent metal requirements must be satisfied. Refractory metals that meet these requirements include Titanium (Ti), Tantalum (Ta), Molybdenum (Mo), Tungsten (W), and Platinum (Pt). In general, silicides can be formed by three techniques, a) deposition of the pure metal on silicon (i.e., onto single crystal and/or polycrystalline Si), b) simultaneous evaporation of the silicon and the refractory metal from two sources (co-evaporation), and c) sputter-depositing the silicide. The advantages and disadvantages of each of these techniques are detailed by S. Wolf, Vol. I, pages 388–392.

In the sputtering method, composite targets for silicide deposition are generally manufactured by power metallurgical technique, which employ a mixture of particles of metal (e.g., tungsten) and Si. The powders are pressed together, and sintered at high temperatures and pressures, to 70–80% of their theoretical density.

One way to produce a $WSi_2$ layer onto a semiconductor substrate is to perform a CVD process with $WF_6$ vapor and silane vapor. The following chemical process results:

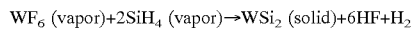

$WF_6$ (vapor)+$2SiH_4$ (vapor)→$WSi_2$ (solid)+$6HF$+$H_2$

Other systems for CVD deposition of $WSi_2$ have been developed, including single-wafer, plasma-enhanced deposition machines. These other systems are described in detail in Volume I, Chapter 6 of the S. Wolf reference listed above.

Extensive efforts have been directed towards developing a CVD of tungsten (W) thin films for refractory metal interconnects for VLSI. CVD tungsten is a good candidate for interconnect applications, because of its low resistance, low stress, excellent conformal step coverage, and because its thermal expansion coefficient closely matches that of silicon. Some disadvantages of W include: a) poor adhesion to oxides and nitrides, b) oxides form on W at temperatures >400°, and c) silicides form at temperatures >600° C. Details of the advantages and disadvantages are given in Volume I, pages 399–400 of the S. Wolf reference.

In VLSI fabrication, a particular problem has arisen in the formation of high density conductive lines, due to the prevalence of cracking and gaps forming in those lines. This problem is particularly evident in integrated circuit memory arrays where frequent cracks have been found in word lines, thereby directly affecting the reliability of the integrated circuit memory.

SUMMARY OF THE INVENTION

It is an object of the present invention to lessen the cracking and/or peeling effects caused by depositing $WSi_x$ with silane gas in a semiconductor substrate fabrication process.

To achieve the above-mentioned object and other advantages, a method of depositing metal silicide onto a semiconductor substrate includes a step of depositing a first metal silicide layer with silane gas onto the semiconductor substrate. The method further includes a step of thermally treating and chemically cleaning the semiconductor substrate. The method also includes a step of depositing a second metal silicide layer with silane gas onto the thermally treated and cleaned first metal silicide layer.

The above-mentioned objects and advantages may also be achieved by a method of depositing metal silicide onto a semiconductor substrate, which includes a step of depositing, by a CVD process, a first metal silicide layer with silane gas onto the semiconductor substrate. The method also includes a step of thermally treating the semiconductor substrate. The method further includes a step of depositing, by the CVD process, a second metal silicide layer with silane gas onto the semiconductor substrate.

BRIEF DESCRIPTION OF THE DRAWINGS

The above-mentioned objects and advantages of the invention will become more fully apparent from the following detailed description when read in conjunction with the accompanying drawings, with like reference numerals indicating corresponding parts throughout, and wherein.

DETAILED DESCRIPTION OF THE PREFERRED EMBODIMENT

The present invention will be discussed in detail below with reference to the drawings.

Figure 1A:
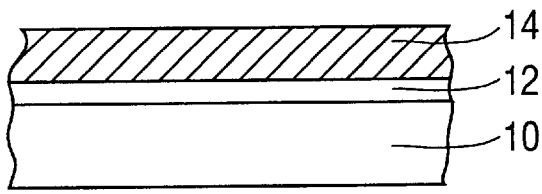
FIGS. 1A–1G show steps involved in the formation of a semiconductor substrate to have a $WSi_x$ layer according to a conventional process.

FIGS. 1A–1G show the formation of an integrated circuit, such as a bipolar transistor, via a $WSi_x$ (x=2 or 4) deposition with silane gas. In a first step, as shown in FIG. 1A, a thin layer of insulator is formed over the silicon substrate 10. This insulator layer 12 may conveniently comprise a thermally grown $SiO_3$, and is typically referred to as a pad oxide layer. As shown in FIG. 1A, another insulator layer is formed over the insulator layer 12, and serves as a second insulator layer 14 that functions as an oxidation mask. By way of example, this second different insulator layer 14 may comprise a nitride layer formed by means of a CVD process.

Figure 1B:
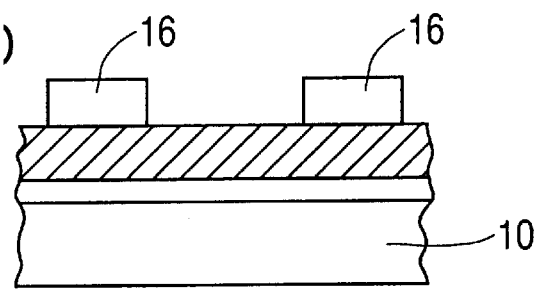

Referring now to FIG. 1B, the semiconductor structure is shown with a patterned photo-resist layer 16 formed thereon. The resist pattern is used to protect the areas where active devices will be formed. This patterning may be accomplished by means of standard lithography and etching techniques which are well known in the art.

Figure 1C:
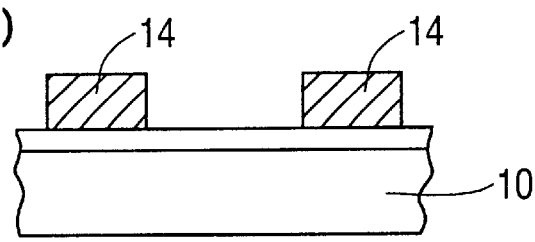

Referring now to FIG. 1C, the semiconductor structure is shown after an etching step and a photo-resist clean step. The etching step operates to remove all of the nitride layer 14 that is exposed, i.e., that is not covered or protected by the photo-resist pattern 16 of FIG. 1B.

Figure 1D:
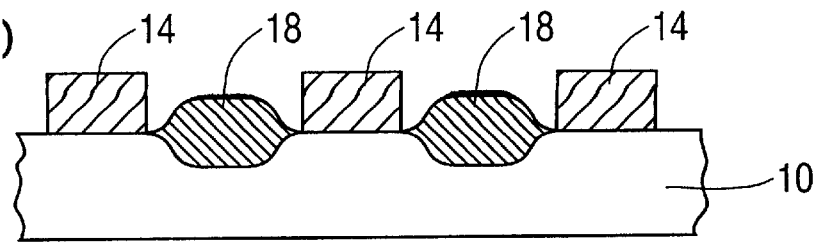

Referring now to FIG. 1D, a field oxide region 18 is grown, by way of example, by a thermal growth process using wet oxidation, in the exposed areas of the layer 12, i.e., those areas of the layer 12 which are not covered by the nitride pattern 14. A typical field oxide region may rise above the surface of the surrounding semiconductor area by about 1000 to 4000 angstroms. The field oxide region 18 provide isolation between separate components (i.e., transistors) formed on the same semiconductor substrate.

Figure 1E:
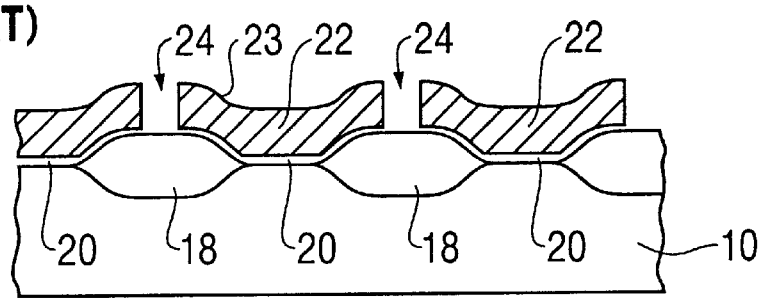

Referring now to FIG. 1E, the nitride pattern 14 is removed by means of a nitride clean step and a thin tunnel oxide layer 20 is formed over the semiconductor substrate including the field oxide region 18. This thin oxide layer 20 may be formed utilizing standard thermal growth techniques in an oxidation ambient. In a preferred embodiment, this oxide layer 20 may be on the order of 100 angstroms. Following the formation of this oxide layer 20, a conductive polysilicon layer 22 is deposited thereover, by way of example, by a CVD process. The polysilicon layer 22 may be amorphous polysilicon and may include doping, or doping may be added after deposition to provide a desired conductivity. A typical conductivity for this polysilicon layer 22, which is set forth by way of example, and not by way of limitation, is 400 ohms per square. This polysilicon layer 22 typically will be deposited to a thickness on the order of 500–1000 angstroms.

The polysilicon layer deposition step is then followed by an etching step to form openings 24 through the polysilicon layer 22 down to the field oxide layer 18. These openings are formed by directionally etching the top surface of the doped polysilicon layer after masking using standard photo-lithographic techniques. Such photo-lithographic masking techniques are well known in the art and include, by way of example, disposing an insulator of $SiO_2$ or some other etch-resistant material on the top surface of the material to be etched. This $SiO_2$ layer may be deposited or grown by any known means in the art, such as by oxidizing the polysilicon layer in steam or in wet oxygen. A portion of the insulating layer of $SiO_2$ is removed using a photo-resist layer selectively exposed to UV radiation and then developed chemically to act as a mask for the $SiO_2$. The masked $SiO_2$ may then be etched with a buffered hydrofluoric acid solution, for example, leaving a remaining portion of the $SiO_2$ layer above the polysilicon surface in a desired pattern. Then, a directional etch is utilized to form trenches with vertical sidewalls in areas of polysilicon not covered by the patterned $SiO_2$ mask. Typical chemical directional etches are $SF_6CClF_2$ in a plasma-form. The result of this directional etching process are openings having sidewalls which are substantially vertical.

Figure 1F:
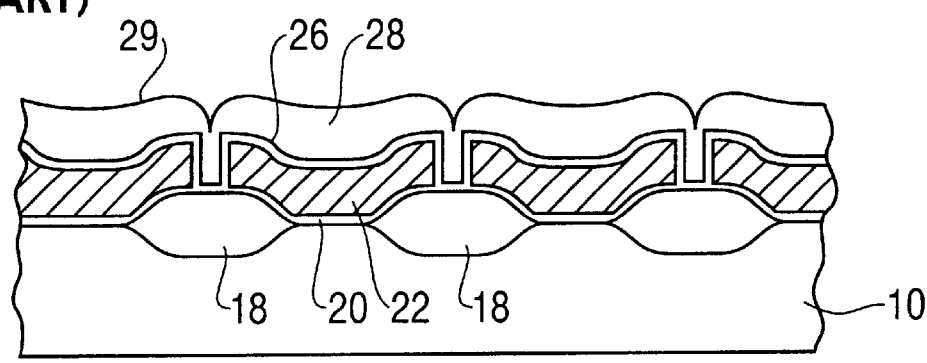

Referring now to FIG. 1F, the semiconductor structure is shown after an ONO process and the deposition of a second layer of polisilicon. Specifically, the ONO layer 26 may be formed, by way of example, by forming a first layer of oxide by means of a thermal growth process, forming a second layer of nitride by means of chemical vapor deposition, and forming a third layer of oxide by means of chemical vapor deposition. By way of example, but not by way of limitation, this layer 26 may be on the order of 160 angstroms.

Following the deposition of ONO isolation layer 26, a second layer of polysilicon 28 is deposited in a well-known manner, such as by a CVD process. This second layer of polysilicon 28 may have a thickness on the order of 1200 angstroms. This second layer of polysilicon 28 should have a higher doping level than the first layer of polysilicon 22. This doping to obtain the desired conductivity may be accomplished during the layer deposition phase or after the deposition of the polysilicon layer.

Figure 1G:
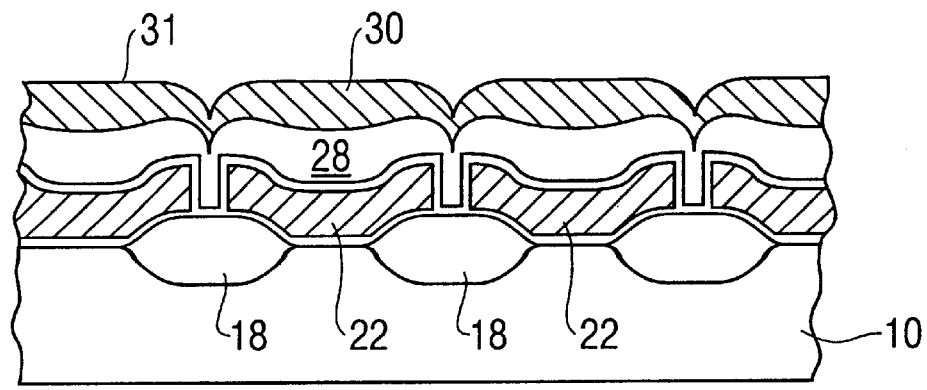

After the second layer of polysilicon 28 has been deposited onto the semiconductor structure (and after any doping has been applied to that second layer of polysilicon 28), $WSi_x$ (x=2 or 4) is deposited onto the semiconductor structure with silane gas, resulting in a structure having a $WSi_x$ layer 30 as shown in FIG. 1G.

Figure 2:
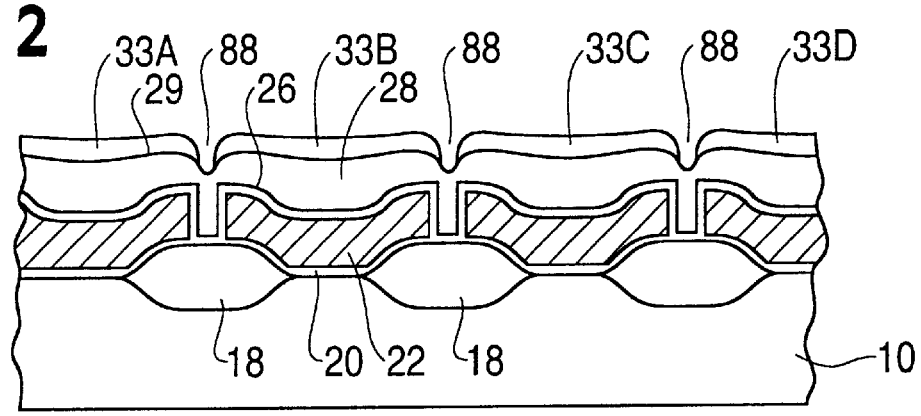
FIG. 2 shows large cracks that are formed in the $WSi_x$ layer after thermal processing of the semiconductor substrate formed according to the conventional process.

It can be seen from a review of FIG. 1G that there is a significant depression or indent in the $WSi_x$ layer 30 and in the second polysilicon layer 28 above the field oxide region 18. This depression is due to the process requirement that the second polysilicon material fill the openings above each of the field oxide regions 18, and that the $WSi_x$ layer 30 is deposited onto the second polysilicon layer 28. The depression in the second polysilicon layer 28 may cause cracking or peeling in material layers deposited over the top of this layer 28, such as the $WSi_x$ layer 30. This cracking or peeling may especially occur after the semiconductor structure has gone through subsequent thermal processing after deposition, to result in a structure as shown in FIG. 2. In FIG. 2, cracks 88 appear in the $WSi_x$ layer 30, with the cracks 88 extending all the way through the $WSi_x$ layer 30 so as to isolate the $WSi_x$ layer 30 into first through fourth $WSi_x$ layers 30A to 30D. The cracks 88 are undesirable, and may cause defective operation of a transistor (or other device) that is formed from the layers deposited onto the substrate.

Figure 3A:
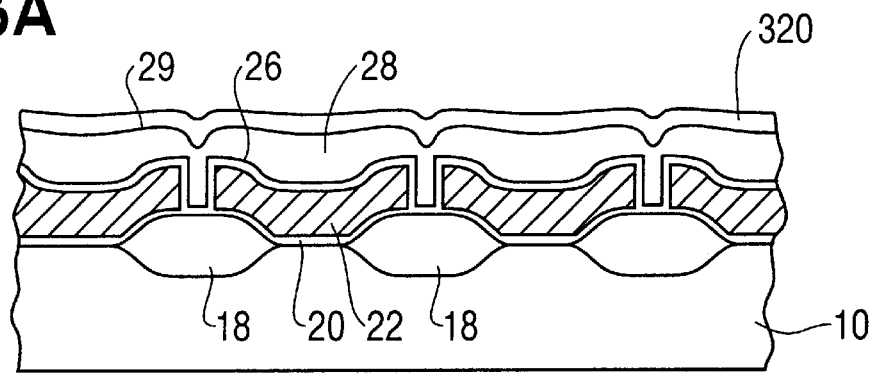
FIGS. 3A–3B show a semiconductor substrate having a $WSi_x$ layer that is formed by a method according to a preferred embodiment of the invention.
Figure 3B:
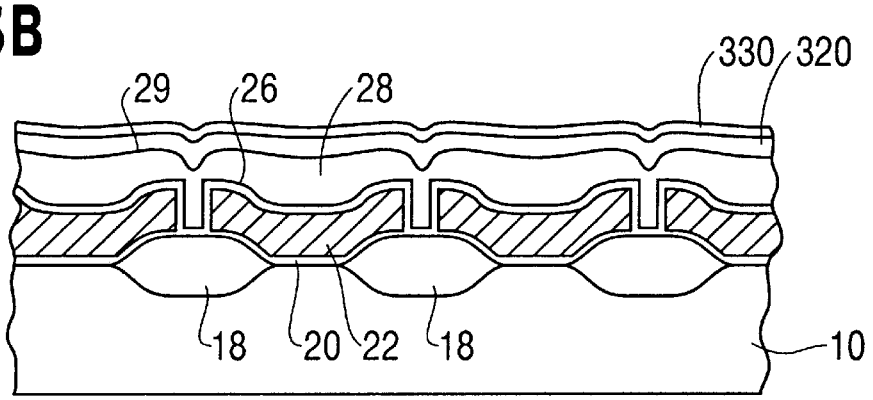

FIGS. 3A and 3B show the formation of a semiconductor substrate according to a preferred embodiment of the invention. In the preferred embodiment of the invention, the deposition of $WSi_x$ (x=2 or 4) is divided into two separate deposition steps, with a W densification being performed between the two separate deposition steps. By this approach, cracks and/or peeling in the deposited $WSi_x$ layer are less likely to occur after thermal processing than in the conventional approach, and if cracks are to occur, they will tend to be of smaller size than cracks formed after thermal processing using the conventional approach.

In the preferred embodiment of the invention, the steps as shown in FIGS. 1A–1F of the conventional approach are utilized. However, instead of depositing $WSi_x$ in a single step to result in a structure as shown in FIG. 1G, a different scheme is adopted.

In FIG. 3A, a first layer of $WSi_{2.4}$ 320 is deposited with silane gas onto the second layer of polysilicon 28. By way of example and not by way of limitation, the first layer of $WSi_{2.4}$ 320 has a thickness of 900 to 1100 angstroms.

Next, a W densification is performed by thermal treatment and chemical cleaning of the surface of the first layer of $WSi_{2.4}$ 330, so as to remove any oxide formation. The thermal treatment is preferably performed at 600° C.

The chemical cleaning is preferably performed with an SPM plus HPM clean process. In particular, the chemical cleaning is performed in two steps. In a first step, a 4:1 ratio of $H_2SO_4$ (sulfuric acid) and $H_2O_2$ (hydrogen peroxide) solution is applied to the surface-to-be-cleaned at room temperature for 5 minutes, and then a rinse is performed. In a second step, a 6:1:1 ratio of $H_2O$ (water), $H_2O_2$ (hydrogen peroxide) and hydrochloric acid (HCL) solution is applied to the surface-to-be-cleaned at an environment temperature of 60° C., then a rinse is performed, and then a spin dry is performed.

Next, as shown in FIG. 3B, a second layer of $WSi_{2.4}$ 330 is deposited onto the thermally treated and cleaned first layer of $WSi_{2.4}$ 320. By way of example and not by way of limitation, the second layer of $WSi_{2.4}$ 330 has a thickness of 200 to 400 angstroms. Thus, in the exemplary example, a total thickness of the first and second layers of $WSi_{2.4}$ is about 1500 angstroms.

After the second layer of $WSi_{2.4}$ 330 has been deposited onto the substrate, a SiON layer (not shown) may be formed on top of the second layer of $WSi_{2.4}$ 330. The SiON layer serves as a protective layer (a "cap") for the substrate, and protects the $WSi_x$ layer beneath it from oxidation during subsequent oxidation cycles performed on the semiconductor substrate. This helps prevent the $WSi_x$ layer from lifting off of the semiconductor substrate. Also, the SiON layer serves as a bounding layer to keep small cracks formed in the $WSi_x$ layer from expanding to become bigger cracks.

Figure 4:
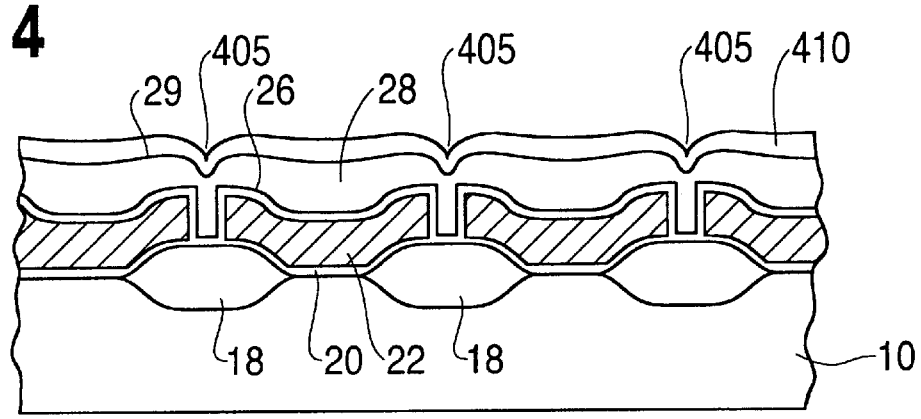
FIG. 4 shows small cracks that are formed in the $WSi_x$ layer after thermal processing of the semiconductor substrate by the method according to the preferred embodiment.

FIG. 4 shows a semiconductor substrate 400 formed with the method of the invention after subsequent thermal processing of the semiconductor substrate 400. In FIG. 4, small cracks 405 are formed in the $WSi_{2.4}$ layer 410. Note that the $WSi_{2.4}$ layer 410 is the combination of the first and second $WSi_{2.4}$ layers 320, 330 as shown in FIG. 3B. The cracks 405 are smaller than the cracks 88 formed after the conventional process, as shown in FIG. 2. Thus, a semiconductor device manufactured according to the preferred embodiment of the invention is less likely to be defective.

While a preferred embodiment has been described herein, modification of the described embodiment may become apparent to those of ordinary skill in the art, following the teachings of the invention, without departing from the scope of the invention as set forth in the appended claims. For example, while the preferred embodiment was described with reference to $WSi_x$ being deposited with silane, other types of refractory metals, such as Ta, Ti, Pt and Mo may be used instead of W and still remain within the teachings of the invention. Also, other gases for epitaxial deposition, such as $SiCl_4$, $SiHCl_3$, and $SiH_2Cl_2$ may be used instead of silane for depositing the refractory metal and still remain within the teachings of the invention.

The present invention is useful for creating semiconductor devices that can be used in memory chip formation, such as in the creating of word lines and bit lines for such memories. One of ordinary skill in the art will recognize that the present invention is applicable to the formation of semiconductor devices suitable for other uses besides memories.

What is claimed is:

1. A method of depositing metal silicide onto a semiconductor substrate, comprising the steps of:
    a) depositing a first metal silicide layer with silane gas onto the semiconductor substrate;
    b) thermally treating and chemically cleaning a top surface of the first metal silicide layer; and
    c) depositing a second metal silicide layer with silane gas onto the thermally treated and cleaned first metal silicide layer.

2. The method according to claim 1, wherein the metal silicide is WSix, where x is 2 or 4.

3. The method according to claim 1, wherein the metal silicide is selected from the group consisting of WSix, TiSi2, TaSix, PtSix, or MoSix, where x is 2 or 4.

4. The method according to claim 1, wherein the thermally treating in the step b) is performed at 600° C.

5. A method according to claim 1, wherein the chemically cleaning in the step b) is performed with a sulphuric acid and hydrogen peroxide (SPM) plus hydrochloric acid and hydrogen peroxide (HBM) cleaning process.

6. The method according to claim 1, wherein the first metal silicide layer is a layer having a thickness in a range of from 900 to 1100 Angstroms.

7. The method according to claim 6, wherein the second metal silicide layer is a layer having a thickness in a range of from 400 to 600 Angstroms.

8. The method according to claim 1, further comprising the step of:
  d) forming a SiON layer on the second metal silicide layer.

9. The method according to claim 8, further comprising the step of:
  e) thermally treating the semiconductor substrate, wherein the steps a) through c) prevent excessive cracks from forming in the first and second metal silicide layers during and after the step e).

10. The method according to claim 1, wherein the steps a) and c) are each performed by a chemical vapor deposition (CVD) process.

11. A method of depositing metal silicide onto a semiconductor substrate, comprising the steps of:
  a) depositing, by a CVD process, a first metal silicide layer with silane gas onto the semiconductor substrate;
  b) chemically cleaning a top surface of the first metal silicide layer; and
  c) depositing, by a CVD process, a second metal silicide layer with silane gas onto the semiconductor substrate.

12. The method according to claim 11, wherein the metal silicide is WSix, where x is 2 or 4.

13. The method according to claim 11, wherein the metal silicide is selected from the group consisting of WSix, TiSi2, TaSix, PtSix, or MoSix, where x is 2 or 4.

14. The method according to claim 11, wherein the chemical cleaning in the step b) is performed with a sulphuric acid and hydrogen peroxide (SPM) plus hydrochloric acid and hydrogen peroxide (HBM) cleaning process.

15. The method according to claim 1, wherein the step b) removes any oxide that may be formed on the first metal silicide layer.

16. The method according to claim 5, wherein the sulphuric acid and hydrogen peroxide (SPM) plus hydrochloric acid and hydrogen peroxide (HBM) cleaning process comprises the following substeps:
  b1) applying a 4:1 ratio of $H_2SO_4$ and $H_2O_2$ solution to the top surface of the first metal silicide layer at room temperature for 5 minutes;
  b2) rinsing the semiconductor substrate; and
  b3) applying a 6:1:1 ratio of $H_2O$, $H_2O_2$ and HCL solution to the top surface of the first metal silicide layer at 60° C.;
  b4) rinsing the semiconductor substrate; and
  b5) spin drying the semiconductor substrate.

17. A method according to claim 2, wherein the step b) increases a density of tungsten within the first metal silicide layer.

18. A method according to claim 2, wherein the step b) results in tungsten densification of the first metal silicide layer.

19. A method according to claim 1, wherein the second metal silicide layer is formed directly above the thermally treated and cleaned first metal silicide layer, and the first metal silicide layer is formed above a top surface of the semiconductor substrate.

* * * * *